United States Patent
Johnsson et al.

[11] Patent Number: 5,851,285
[45] Date of Patent: Dec. 22, 1998

[54] MANUFACTURE OF TRANSITION METAL CARBIDE, NITRIDE, AND CARBONITRIDE WHISKERS CONTAINING TWO OR MORE TRANSITION METALS

[75] Inventors: Mats Johnsson, Hägersten; Niklas Ahlén, Tullinge; Mats Nygren, Bromma; Magnus Ekelund, Järna; Gunnar Brandt, Solna, all of Sweden

[73] Assignee: Sandvik AB, Sandviken, Sweden

[21] Appl. No.: 770,849

[22] Filed: Dec. 20, 1996

Related U.S. Application Data

[63] Continuation-in-part of Ser. No. 504,779, Jul. 20, 1995.

[30] Foreign Application Priority Data

Apr. 4, 1996 [SE] Sweden ................ 9601335-4

[51] Int. Cl.$^6$ .................................................. C30B 21/06
[52] U.S. Cl. ................................ 117/87; 117/75; 117/76; 117/921
[58] Field of Search .................. 117/75, 76, 87, 117/92 L, 952, 954

[56] References Cited

U.S. PATENT DOCUMENTS

| | | | |
|---|---|---|---|
| 3,754,076 | 8/1973 | Cutler | 423/345 |
| 4,283,375 | 8/1981 | Horne, Jr. et al. | 423/345 |
| 4,284,612 | 8/1981 | Horne, Jr. et al. | 423/345 |
| 4,284,844 | 8/1981 | Belles | 381/336 |
| 4,883,559 | 11/1989 | Bamberger | 117/75 |
| 4,888,084 | 12/1989 | Nixdorf et al. | 117/75 |
| 5,094,711 | 3/1992 | Narashimhan et al. | 117/87 |
| 5,118,488 | 6/1992 | Bamberger | 117/87 |
| 5,160,574 | 11/1992 | Pearson et al. | 117/75 |
| 5,221,526 | 6/1993 | Qi et al. | 423/345 |
| 5,383,421 | 1/1995 | Dunmead et al. | 117/4 |
| 5,403,519 | 4/1995 | Rittler | 252/582 |
| 5,404,836 | 4/1995 | Milewski | 117/87 |
| 5,488,016 | 1/1996 | Rittler | 501/39 |

*Primary Examiner*—Felisa Garrett
*Attorney, Agent, or Firm*—Burns, Doane, Swecker & Mathis, L.L.P.

[57] ABSTRACT

There is disclosed a method of producing whiskers in large volumes and at low cost to be used as reinforcing material. The whiskers are solid solutions between two or more transition metal carbides, nitrides and carbonitrides, $(Me_{1-x-y}Me'_{x+y})C_{1-z}N_z$, having preferably submicron diameters, where Me' is one or more transition metals other than Me. The whiskers are suitable for use as a reinforcement material in a wide range of materials, including metals, intermetallics, plastics, ceramics and metallic bonded hard material. Transition metal oxides, hydroxides or alkali compounds thereof are mixed with carbon powder. The carbon source is added in an amount to satisfy the stoichiometric requirements of the carbide or nitride. A halogenide salt is used as a volatilization agent for the transition metals and a catalyst such as Ni or Co that is able to dissolve transition metals plus C and/or N. The reactant powders are blended so as to intimately mix them. Finally, the mixed starting material is subjected to nitriding, carbonizing or carbonitriding heat treatments in order to produce the desired whiskers.

7 Claims, 5 Drawing Sheets

MANUFACTURE OF TRANSITION METAL CARBIDE, NITRIDE, AND CARBONITRIDE WHISKERS CONTAINING TWO OR MORE TRANSITION METALS

This application is a continuation-in-part application of U.S. Ser. No. 08/504,779, filed Jul. 20, 1995.

BACKGROUND OF THE INVENTION

The present invention relates to a method of producing, in large volumes and at low cost, transition metal carbide, nitride or carbonitride whiskers containing two or more transition metals. The whiskers are generally submicron in diameter suitable as reinforcement material in ceramic cutting tools, metals, intermetallics, plastics and metallic bonded hard material.

During the last decades, great progress has been made in the development of high-performance materials. One of the important reasons to this progress has been the production of inorganic (ceramic) whiskers which have high tensile strength and modulus values as well as resistance to high temperatures. The incorporation of these whiskers into advanced ceramics, metals, and polymers has produced composites with superior properties.

Ceramic fibers can be produced by several methods and are most often in the form of single crystals or so-called "whiskers". Several types of ceramic whiskers (oxides, nitrides, carbides and borides) exist. For example, SiC whiskers are well-known as a successful reinforcement in cutting tool materials. Most of the development work has hence been directed toward silicon carbide whiskers (e.g., $Al_2O_3$-matrix/SiC-whiskers composites). Some efforts have, however, also been made to develop other metal carbide, nitride and boride whiskers particularly of transition metals such as Ti, Ta, Nb, Zr, and Hf.

Ceramic whiskers available commercially are in most cases very expensive and in the case of most transition metal whiskers, no commercial producer exists.

U.S. Pat. No. 4,883,559 discloses a process for making transition metal whiskers from melt of cyanide salt, alkali metal oxides and a transition metal oxide.

U.S. Pat. No. 5,094,711 discloses a process for producing single crystal titanium carbide whiskers by chemical vapor deposition (CVD).

U.S. Pat. No. 5,160,574 discloses a process for production of small diameter titanium carbide whiskers by a CVD method.

U.S. patent application Ser. No. 08/772,099, corresponding to Swedish patent application 9504626-4 (our reference: 024444-258, filed on even date herewith) as well as U.S. patent application Ser. No. 08/504,779, filed Jul. 20, 1995 (our reference: 024444-131) each and 9504625-6 (our reference: 024444-257, filed on even date herewith) disclose a process for making transition metal carbide, nitride, or carbonitride whiskers from mixtures of a transition metal oxide, a halogenide source, a metal catalyst, and a carbon source containing volatile constituents.

The above-cited patents and patent applications all relate to whisker materials containing only one metal in addition to carbon, nitrogen, oxygen or combinations thereof. Making whiskers where two or more metals form a solid solution has not been considered possible because of difficulties to control the complex chemical reactions leading to the formation of whiskers within a well-defined composition range. It has now, however, surprisingly been found that it is possible to synthesize transition metal carbide, nitride or carbonitride whiskers containing two or more transition metals in a solid solution provided that the temperature is accurately controlled.

OBJECTS AND SUMMARY OF THE INVENTION

It is an object of this invention to avoid or alleviate the problems of the prior art.

It is further an object of this invention to provide a method of producing, in large volumes and at low cost, high strength transition metal carbide, nitride or carbonitride whiskers, which: (i) are straight; (ii) have smooth surfaces; (iii) have a diameter in the micrometer range, preferably being submicron; and (iv) contain two or more transition metals from the Ti and V groups. The formed whiskers can be used as reinforcing materials in advanced materials.

These and other objects are provided by a method of producing whiskers in large volumes having an overall composition of $(Me_{1-X-Y}Me'_{X+Y})C_{1-Z}N_Z$ with Me being a transition metal and Me' being one or more different transition metals comprising intimately mixing a carbon source, a mixture of two or more transition metal oxides, hydroxides or alkali oxide compounds in amounts satisfying the stoichiometric requirements of the desired whisker, at least one of the alkali, alkali earth halogenide containing salts LiCl, NaCl, KCl, $CaCl_2$, $MgCl_2$, LiF, NaF or KF in an alkali-alkali earth-halogenide/transition metal molar ratio 0.1-3, and a Ni and/or Co-containing catalyst in a (Ni +Co)/transition metal molar ratio 0.005-0.5 and heating the mixture to 1000°–1800° C. for 0.5–15 hours, at 10 mbar–50 bar pressure in an inert or non-oxidizing atmosphere depending on the desired whiskers.

DETAILED DESCRIPTION OF THE PREFERRED EMBODIMENTS OF THE INVENTION

Figure 1:
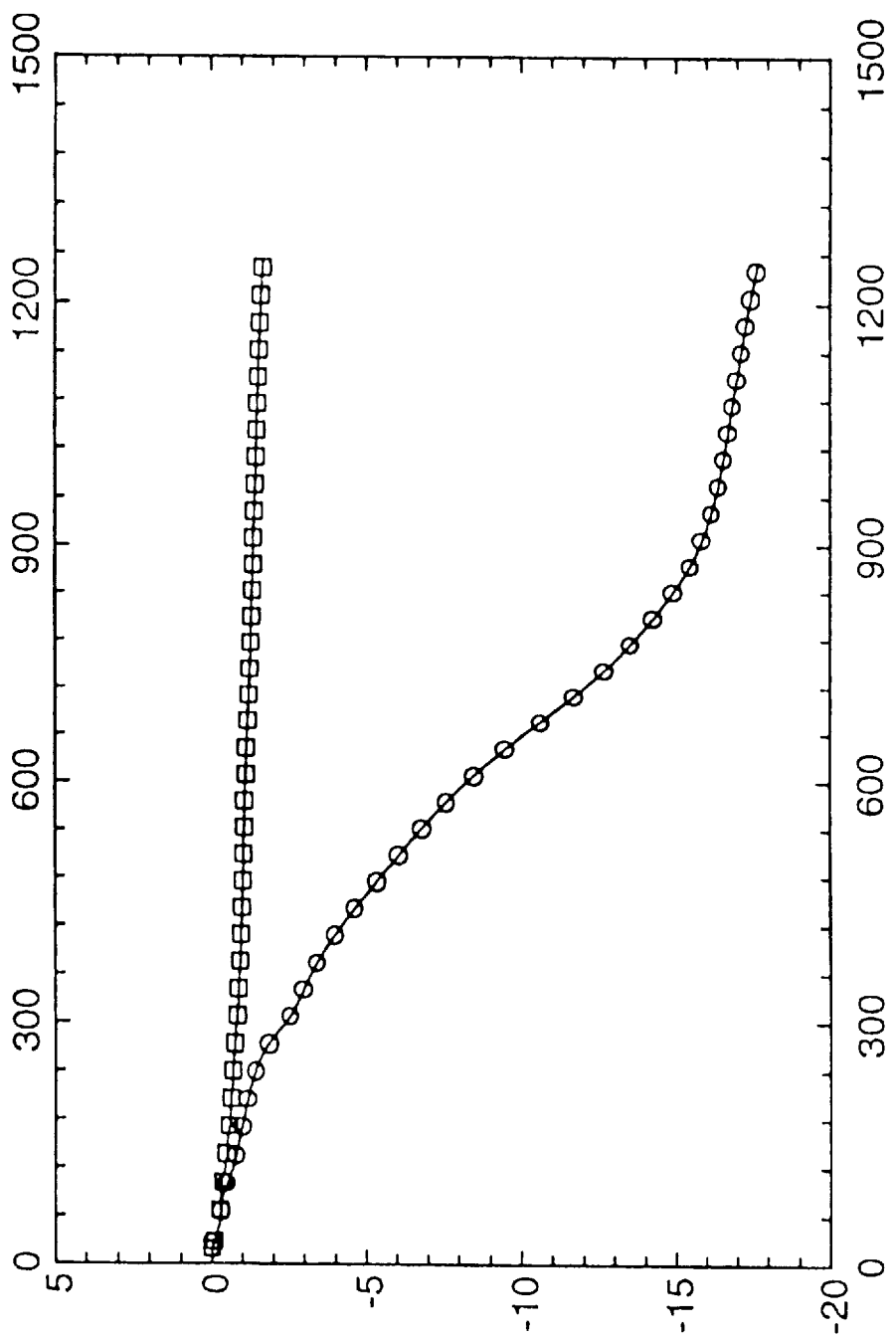
FIG. 1 shows the weight loss in percent versus temperature curve in nitrogen atmosphere for a carbon source with volatile components (Degussa FW200) according to the present invention and for a carbon powder without volatile components (Degussa Printex 90).

By changing the composition within a solid solution of the overall composition of $(Me_{1-X-Y}Me'_{X+Y})C_{1-Z}N_Z$ (where X, Y and Z are each from 0 to 1), it is possible to change the material properties so that a desired temperature expansion coefficient or a desired chemical or physical property can be obtained. The cost for producing a whisker material can be lowered by partly substituting an expensive transition metal with a cheaper one where, for example, the temperature expansion coefficient or the desired chemical properties are not so much influenced by changes in the composition. It should be understood that any number of further metals Me", etc., can be added as long as the total of added metals Me, Me', Me", etc. add up to X+Y=1.

The whisker growth in the present invention is a VLS-like crystal growth process (VLS=Vapor-Liquid-Solid). This process implies transport of the transition metals as vapor species to a liquid catalyst at which the desired whisker is grown as a solid. The halogenide source is added as a volatilizing agent for transportation of the transition metals in a gas phase, e.g., as a chloride or oxochloride. One of several possible reaction sequences for a mixture of $TiO_2$ and $Ta_2O_5$ where $Cl_2(g)$ is used as chlorine source is:

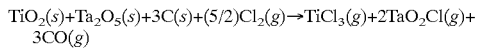

$$TiO_2(s)+Ta_2O_5(s)+3C(s)+(5/2)Cl_2(g)\rightarrow TiCl_3(g)+2TaO_2Cl(g)+3CO(g)$$

The formation of volatile Ti and Ta species provides for gas phase transportation of Ti and Ta to the liquid metal catalyst where the volatile species react further with C and/or N to form a whisker of the composition $(Ta_{1-X}Ti_X)$ $Cl_{1-Y}N_Y$ with $0<X<1$ and $0<Y<1$. The obtained X and Y values depend on the composition of the starting mixture, reaction temperature and atmosphere used.

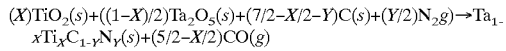

$$(X)TiO_2(s)+((1-X)/2)Ta_2O_5(s)+(7/2-X/2-Y)C(s)+(Y/2)N_2(g)\rightarrow Ta_{1-X}Ti_XC_{1-Y}N_Y(s)+(5/2-X/2)CO(g)$$

The type and grain size of the transition metal oxides in the starting mixture as well as the synthesis temperature has to be determined experimentally according to thermodynamic considerations in order to achieve a whisker with a desired composition and morphology.

The VLS growth process involves several reactions which one by one and/or in combination have to be optimized in order to obtain maximum yield of whiskers.

According to the present invention, it is possible to synthesize transition metal carbide, nitride or carbonitride whiskers of submicron diameter in high yield where two or more transition metals, Me, Me', etc., form a solid solution $(Me_{1-X-Y}Me'_XMe"_Y \ldots etc.)C_{1-Z}N_Z$, from starting mixtures of transition metal oxides, hydroxides or alkali oxides thereof and carbon, preferably as a powder, containing a volatile part and an alkali and/or alkali earth metalhalogenide using a catalyst. The obtained whiskers are straight and smooth and are of superior quality, useful as reinforcement in different types of materials, e.g., plastics, metals, intermetallics, metallic bonded hard materials and ceramics.

Highest yields with the present method have been obtained by using a carbon powder, with a primary grain size (that is, a majority of the powder) of 10–50 nm, containing a volatile part in amounts between 5 weight % and 30 weight %, which partly volatilizes at temperatures exceeding 500° C. In this way, the porosity of the starting mixture is kept at a high level through the whole reaction. This facilitates the growth of whiskers within the volume of the starting mixture and provides the whisker with an accurate mixture of gas species that are generated from the starting mixture. The porosity also makes it possible for nitrogen gas to penetrate the reaction mixture in case of synthesizing a nitride or carbonitride whisker. The carbon source is a type of carbon black that has oxygen-containing functional groups, such as carboxyl and chinon, on the surface of the powder which are the volatile portion and which volatize at temperatures above 500° C. (see FIG. 1). It may also contain some hydrocarbons. Such a carbon powder is easily produced in large amounts and is commercially available on the market, i.e., Degussa Color Black FW200 or FW2, Degussa Special Black 4, 5 or 6. The porosity of the reaction mixture can easily be controlled by varying the type and amount of volatile component to a greater extent compared to when chopped carbon fibers are used as described in the prior art.

The reaction mixture contains transition metal oxides or alkali oxide compounds thereof with grain sizes typically between 1 and 100 μm, preferably with a fluffy appearance. The above-mentioned carbon powder is added in amounts to satisfy the stoichiometric requirements of the desired compound to be produced. A halogenide containing salt like NaF, KF, LiF, LiCl, NaCl, KCl, $MgCl_2$ or $CaCl_2$, alone or in combination, in a transition metal:halogenide molar ratio of 1:(0.1–2), preferably 1:(0.25–0.5), is added as a volatilization agent for the transition metals. A chlorine-containing gas may also be added to the synthesis atmosphere as a volatilizing agent, alone or in combination with a halogenide salt. A metal catalyst for the whisker growth that is able to dissolve the transition metals plus C and/or N, e.g., Ni and/or Co powder of conventional grain size, or a Ni or Co compound, preferably $NiCl_2$, that will decompose to the metal and a volatile component at the reaction temperature, is added in a transition metal: catalyst molar ratio of 1:(0.01–0.5), preferably 1:(0.02–0.1).

The reactant powders are intimately mixed, wet or dry, in a conventional way. The bulk density of the reaction mixture should be low so that the surfaces of the powders are accessible to reaction gases and so that the reaction products can be removed. The desired bulk density for a particular mixture can be optimized for each system and composition and can easily be made by the skilled artisan.

The reactant mixture is heated in a furnace at 1000°–1800° C., preferably 1100°–1600° C., in a non-oxidative atmosphere, with a low gas flow (≈40 ml/min). The reaction temperature ranges from 1000° C. to 1800° C. and the reaction time from 0.5 to 18 hours, and the pressure in the reaction zone from 10 mbar to 50 bar, preferably 0.5 to 5 bar. The reaction takes place in a reaction chamber made of some inert material, preferably graphite. Different designs can be used but all allowing a controlled gas exchange between the reactor chamber and the surrounding atmosphere. The homogeneity in the composition can be influenced by selecting the synthesis temperature and the particle size of the transition metal oxides in the starting mixture.

The carbon:transition metal molar ratio to be used depends on the selected oxide sources and the desired composition within the transition metal solid solution and if a nitride, carbide or carbonitride is desired. Also, depending on the type of transition metal sources and the type of whiskers to be produced, different synthesis parameters such as temperature and gas phase composition must be chosen.

$N_2$ gas is utilized as the nitrogen source for the production of nitrogen containing whiskers according to the present invention.

Two separate transition metal sources or a combination of several oxide sources are mixed with the carbon powder. As an example, the overall chemical reaction for formation of $(Ta_{0.5}Ti_{0.5})C_{0.5}N_{0.5}$ from, e.g., $TiO_2$ and $Ta_2O_5$ can be written:

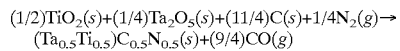

$$(1/2)TiO_2(s)+(1/4)Ta_2O_5(s)+(11/4)C(s)+1/4N_2(g)\rightarrow (Ta_{0.5}Ti_{0.5})C_{0.5}N_{0.5}(s)+(9/4)CO(g)$$

The temperature is preferably held between 1100° C. and 1600° C. in a nitrogen atmosphere for three hours. It is essential for this reaction to proceed to the right, that the CO(g)-partial-pressure is held sufficiently low and that nitrogen gas is provided to the interior of the reaction mixture. This means that the nitrogen gas must penetrate the mixture whose porosity is held at a high level using the carbon powder according to the present invention.

In this way, high quality whiskers with low levels of residual oxygen are obtained.

The overall chemical reaction for formation of $(Ta_{0.5}Ti_{0.5})C$ from, e.g., $TiO_2$ and $Ta_2O_5$ can be written:

$$(1/2)TiO_2(s)+(1/4)Ta_2O_5(s)+(13/4)C(s) \rightarrow (Ta_{0.5}Ti_{0.5})C(s)+(9/4)CO(g)$$

The temperature is preferably held between 1200° C. and 1600° C. in an argon atmosphere for three hours. Argon gas is used instead of nitrogen gas since the tantalum titanium carbonitride is thermodynamically stable compared to the tantalum titanium carbide at the reaction temperature.

By choosing an intermediate amount of carbon, a nitrogen atmosphere and a temperature in the same range as for the nitride and carbide synthesis, carbonitride whiskers are obtained.

The result of the synthesis according to the present invention, is a mixture of generally submicron diameter whiskers in an amount of 70% to 90% by volume. In addition, submicron particles of the same compound are formed. This high whisker yield makes an extra separation of whiskers and particles unnecessary. However, if an even higher yield is desired, a subsequent refinement step can be applied.

The preparation conditions given above, both with regard to the starting formulation and to the synthesis parameters, are related to the equipment used, design of the reaction chamber, the choice of raw materials, etc. It is within the purview of the skilled artisan using other equipment and other raw materials to determine the optimal conditions by experiments.

The invention is additionally illustrated in connection with the following Examples which are to be considered as illustrative of the present invention. It should be understood, however, that the invention is not limited to the specific details of the Examples.

EXAMPLE 1

$(Ti_{0.5}Ta_{0.5})C$ $TiO_2$ rutile powder (Aldrich) and $Ta_2O_5$ powder (Starck ceramic grade) were mixed with carbon powder (Degussa FW200), NaCl (Akzo) and Ni powder (Cerac 325 mesh) with mole fractions: $TiO_2$:$Ta_2O_5$=1:0.5, $TiO_2$:C=1:3, $Ta_2O_5$:C=1:7, $(TiO_2+Ta_2O_5)$:C=1:5, $(TiO_2+Ta_2O_5)$:NaCl=1:0–5, and $(TiO_2+Ta_2O_5)$:Ni=1:0–05. The carbon source contained 21 weight % volatile components which was compensated for. The powders were dry mixed in a blender for 5 minutes and subjected to carbothermal heat treatment with the following process parameters:

T=1250° C.

t=3 hours

Atmosphere=Ar(g)

p(Ar)=1 bar

Figure 2:
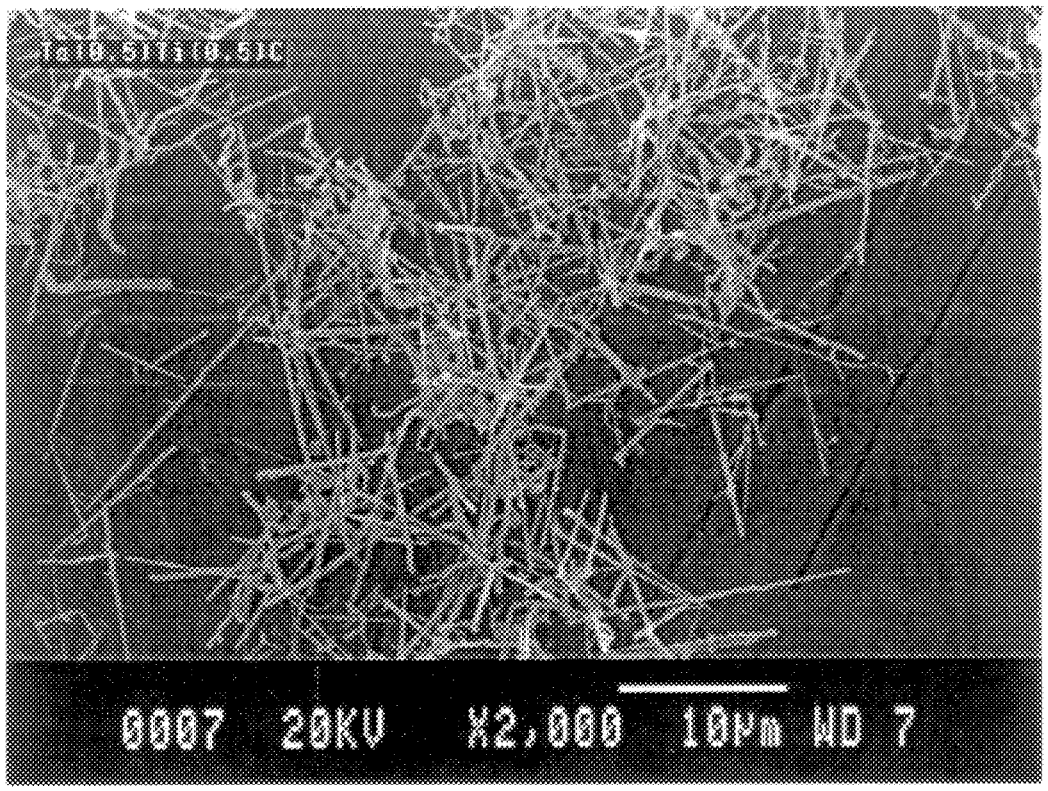
FIG. 2 shows a micrograph of (Ti,Ta)C whiskers in Example 1 synthesized according to the present invention.
Figure 3:
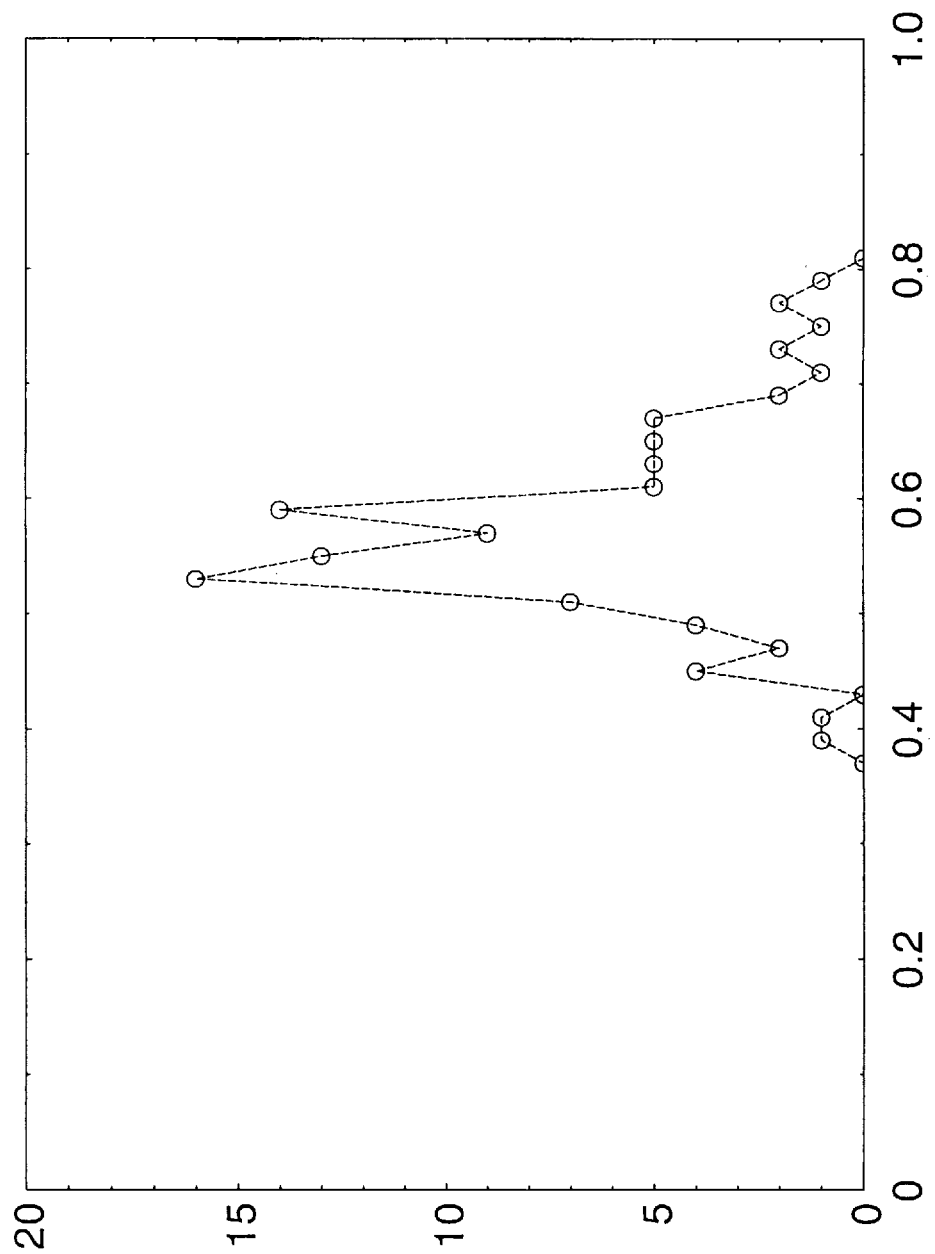
FIG. 3 shows a plot of 100 EDS analyses of whiskers in Example 1 revealing a composition close to the nominal composition $(Ti_{0.5}Ta_{0.5})C$.

The whiskers produced consisted of (Ti,Ta)C. The whisker yield was approximately 80% by volume. The whiskers were straight and of submicron size (see FIG. 2). EDS analysis revealed a composition close to $(Ti_{0.58}Ta_{0.42})C$ (see FIG. 3).

EXAMPLE 2

$(Ti_{0.5}Ta_{0.5})C_{0.5}N_{0.5}$ $TiO_2$ rutile powder (Aldrich) and $Ta_2O_5$ powder (Starck ceramic grade) were mixed with carbon powder (Degussa FW200), NaCl (AkzO) and Ni powder (Cerac 325 mesh) with mole fractions: $TiO_2$:$Ta_2O_5$=1:0.5, $TiO_2$:C=1:2, $Ta_2O_5$:C=1:7, $(TiO_2+Ta_2O_5)$:C=1:0.5, $(TiO_2+Ta_2O_5)$:NaCl=1:0.5, and $(TiO_2+Ta_2O_5)$:Ni=1:0.05. The carbon source contained 21 weight % volatile components which were compensated for. The powders were dry mixed in a blender for 5 minutes and subjected to carbothermal nitridation heat treatment with the following process parameters:

T=1250° C.

t=3 hours

Atmosphere=$N_2$(g)

p($N_2$)=1 bar

The whiskers produced consisted of (Ti,Ta)C,N. The whisker yield was approximately 80% by volume. EDS analysis revealed a composition close to $(Ti_{0.5}Ta_{0.5})(C,N)$. The carbon and nitrogen contents were determined using a combustion technique giving 5.8 weight % C and 5.0 weight % N implying an overall composition close to $Ti_{0.5}Ta_{0.5}C_{0.55}N_{0.45}$.

EXAMPLE 3

$(Ta_{0.5}Nb_{0.5})C$ $Ta_2O_5$ powder (Starck ceramic grade) and $Nb_2O_5$ (Starck ceramic grade) were mixed with carbon powder (Degussa FW200), NaCl (Akzo) and Ni powder (Cerac 325 mesh) with mole fractions: $Ta_2O_5$:$Nb_2O_5$=1:1, $Ta_2O_5$:C=1:7, $Nb_2O_5$:C=1:7, $(Ta_2O_5+Nb_2O_5)$:NaCl=1:0.5, and $(Ta_2O_5+Nb_2O_5)$:Ni=1:0.05. The carbon source contained 21 weight % volatile components which was compensated for. The powders were dry mixed ia a blender for 5 minutes and subjected to carbothermal heat treatment with the following process parameters:

T=1200° C.

t=3 hours

Atmosphere=Ar(g)

p(Ar)=1 bar

The whiskers produced consisted of (Ta,Nb)C. The whisker yield was approximately 70% by volume. EDS analysis revealed a composition close to $(Ta_{0.5}Nb_{0.05})C$.

EXAMPLE 4

$(Ti_{0.4}Ta_{0.4}Nb_{0.2})C$ $TiO_2$ rutile powder (Aldrich), $Ta_2O_5$ powder (Starck ceramic grade) and $Nb_2O_5$ (Starck ceramic grade) were mixed with carbon powder (Degussa FW200), NaCl (Akzo) and Ni powder (Cerac 325 mesh) with mole fractions: $TiO_2$:$Ta_2O_5$=1:0.5, $TiO_2$:$Nb_2O_5$=1:0.25, $TiO_2$:C=1:3, $Ta_2O_5$:C=1:7, $Nb_2O_5$:C=1:7, $(TiO_2+Ta_2O_5+Nb_2O_5)$:NaCl=1:0.5, and $(TiO_2+Ta_2O_5+Nb_2O_5)$:Ni=1:0.05. The carbon source contained 21 weight % volatile components which were compensated for. The powders were dry mixed in a blender for 5 minutes and subjected to carbothermal heat treatment with the following process parameters:

T=1210° C.

t=3 hours

Atmosphere=Ar(g)

p(Ar)=1 bar

Figure 4:
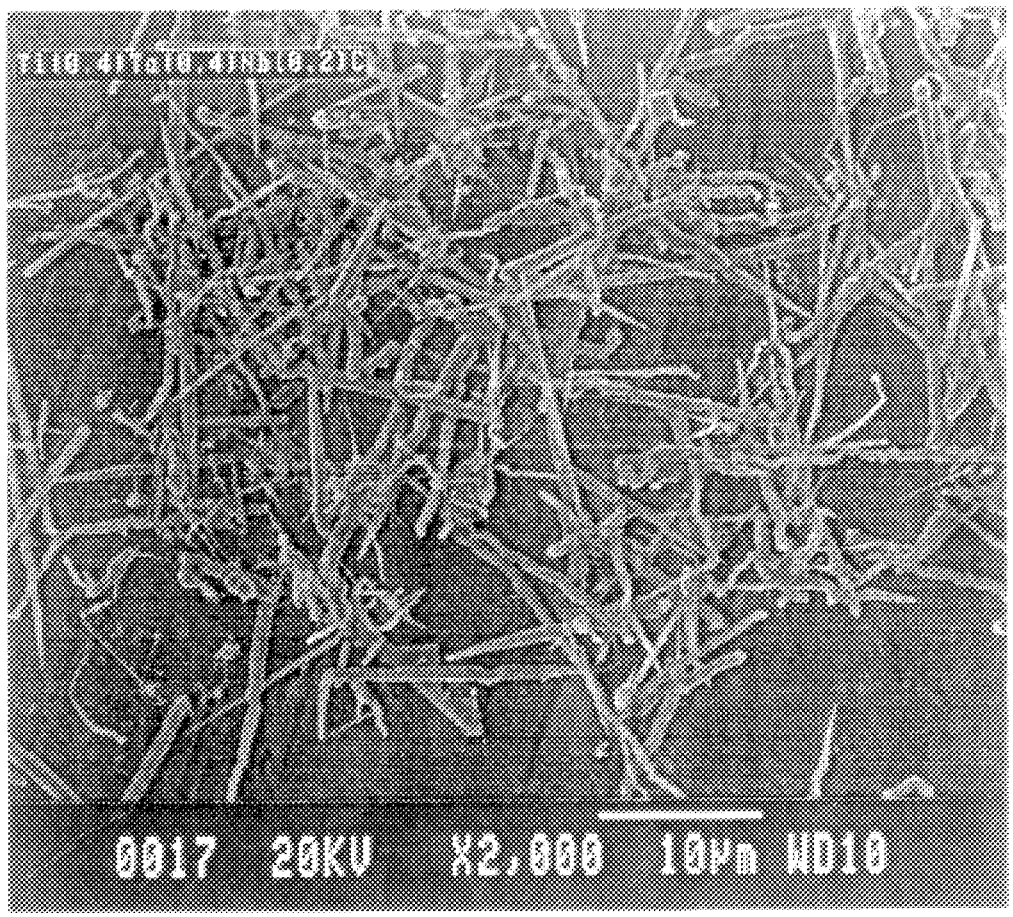
FIG. 4 shows a micrograph of (Ti,Ta,Nb)C whiskers in Example 4 synthesized according to the present invention.
Figure 5:
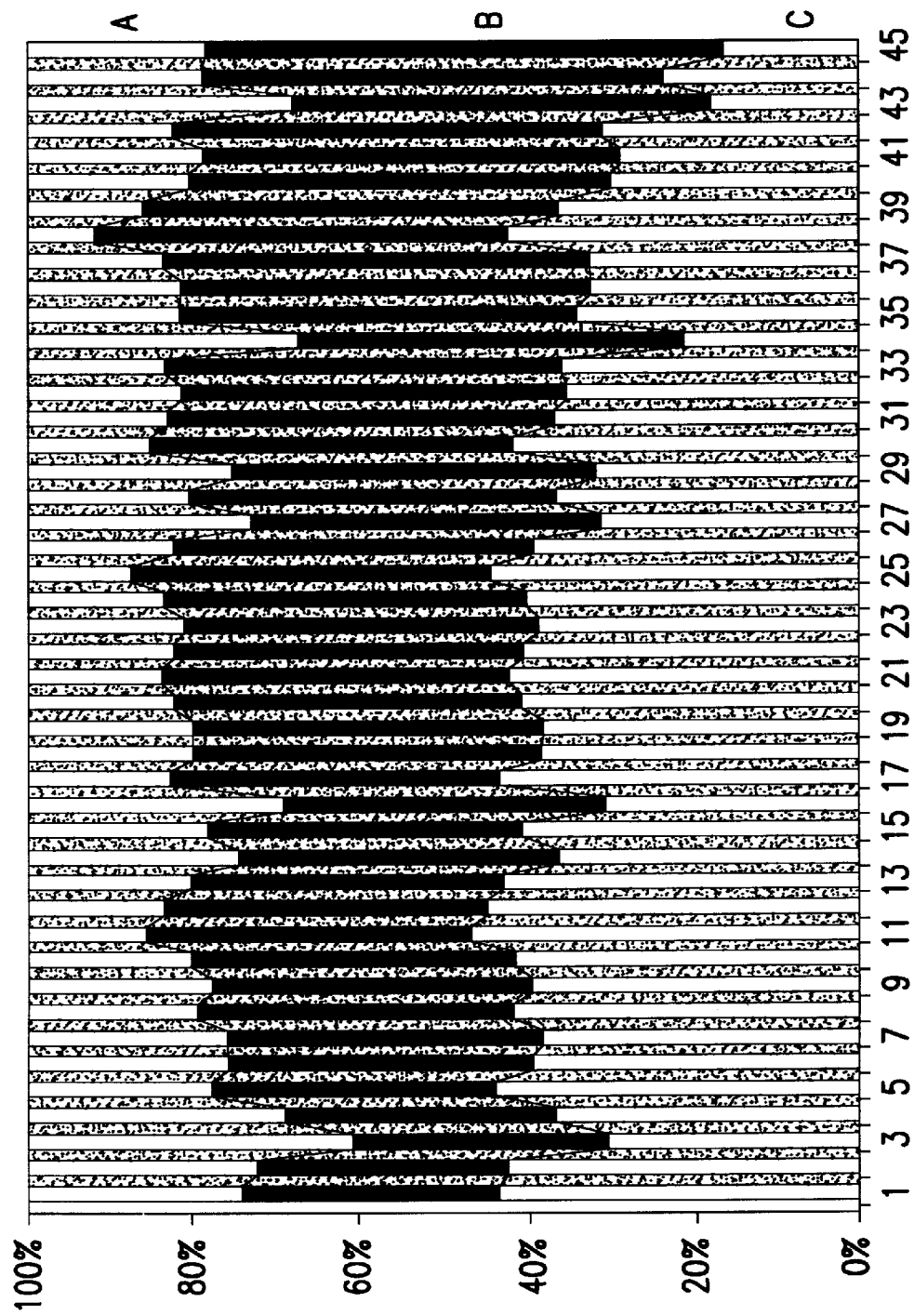
FIG. 5 shows a plot of 45 EDS analyses of whiskers in Example 4 revealing a composition close to the nominal composition $(Ti_{0.4}Ta_{0.4}Nb_{0.2})C$. In this figure A=content of Nb B=content of Ta C=content of Ti

The whiskers produced consisted of (Ti,Ta,Nb)C. The whisker yield was approximately 80% by volume, see FIG. 4. EDS analysis revealed a composition close to $(Ti_{0.36}Ta_{0.42}Nb_{0.22})C$ (see FIG. 5).

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of producing whiskers in large volumes having an overall composition of $(Me_{1-X-Y}Me'_{X}Me''_{Y} \ldots$ etc.$)C_{1-Z}N_{Z}$ with Me, Me' and Me" equal to different transition metals such as Ti, Ta, Nb, Zr, and Hf respectively comprising mixing a carbon source, a mixture of two or more transition metal oxides, hydroxides or alkali oxide compounds, at least one of the alkali, alkali earth halogenide containing salts LiCl, NaCl, KCl, $CaCl_2$, $MgCl_2$, LiF, NaF or RF in an alkali-alkali earth-halogenide/transition metal molar ratio 0.1-3, and at least one of a Ni-containing and Co-containing catalyst thereof in a (Ni+Co)/transition metal molar ratio 0.005-0.5 and heating the mixture to 1000°–1800° C. for 0.5–15 hours, at 10 mbar–50 bar pressure in an inert or non-oxidizing atmosphere.

2. The method of claim 1 wherein the atmosphere is Ar, $N_2$, $H_2$ or He or mixtures thereof.

3. The method of claim 1 wherein the homogeneity of the whiskers is influenced by selecting the particle size of the different transition metal oxides, hydroxides or alkali oxide compounds in the starting mixture.

4. The method of claim 1 wherein the carbon powder has a primary grain size of 10–50 nm.

5. The method of claim 1 wherein the volatile part of the carbon powder is from 5–30 weight % of the carbon powder.

6. The method of claim 1 wherein the mixture is heated to a temperature of 1000°–1800° C. whereby the homogeneity in the composition of the mixed carbine, nitride or carbonitride whiskers is influenced by a synthesis temperature.

7. The method of claim 1 wherein the atmosphere contains a chlorine-containing gas either in addition to or instead of the halogenide-containing salt.

* * * * *